US007811477B2

(12) United States Patent
Lee et al.

(10) Patent No.: US 7,811,477 B2
(45) Date of Patent: *Oct. 12, 2010

(54) COMPOSITION OF CONDUCTING POLYMER AND ORGANIC OPTO-ELECTRONIC DEVICE EMPLOYING THE SAME

(75) Inventors: Tae-Woo Lee, Seoul (KR); Jong-Jin Park, Guri-si (KR); Sang-Yeol Kim, Gwacheon-si (KR); Mu-Gyeom Kim, Hwascong-si (KR); Eun-Sil Han, Yongin-si (KR); Dal-Ho Huh, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 989 days.

This patent is subject to a terminal disclaimer.

(21) Appl. No.: 11/435,819

(22) Filed: May 18, 2006

(65) Prior Publication Data

US 2006/0261332 A1 Nov. 23, 2006

(30) Foreign Application Priority Data

May 19, 2005 (KR) ............... 10-2005-0042189

(51) Int. Cl.
   *H01B 1/12* (2006.01)
   *B32B 27/28* (2006.01)
   *H01L 31/00* (2006.01)

(52) U.S. Cl. ............... 252/500; 428/421; 428/422; 257/40; 136/252; 136/263; 136/253

(58) Field of Classification Search ............... 252/500; 428/421, 422; 257/40; 136/252, 263, 253
See application file for complete search history.

(56) References Cited

U.S. PATENT DOCUMENTS

| 6,025,092 | A | * | 2/2000 | Doyle et al. | ............... 429/213 |
|---|---|---|---|---|---|
| 6,140,436 | A | * | 10/2000 | Doyle et al. | ............... 526/243 |
| 6,576,100 | B2 | * | 6/2003 | Arcella et al. | ............... 204/296 |
| 2004/0254297 | A1 | | 12/2004 | Hsu et al. | |
| 2005/0123803 | A1 | * | 6/2005 | Kim et al. | ............... 428/690 |
| 2006/0180810 | A1 | * | 8/2006 | Lee et al. | ............... 257/40 |
| 2006/0261332 | A1 | * | 11/2006 | Lee et al. | ............... 257/40 |
| 2006/0289858 | A1 | * | 12/2006 | Park et al. | ............... 257/40 |
| 2007/0112133 | A1 | * | 5/2007 | Lee et al. | ............... 525/100 |
| 2007/0138483 | A1 | * | 6/2007 | Lee et al. | ............... 257/79 |
| 2007/0152573 | A1 | * | 7/2007 | Kim et al. | ............... 313/506 |
| 2007/0176174 | A1 | * | 8/2007 | Lee et al. | ............... 257/40 |
| 2007/0187675 | A1 | * | 8/2007 | Lee et al. | ............... 257/40 |
| 2007/0285010 | A1 | * | 12/2007 | Lee et al. | ............... 313/504 |
| 2008/0017852 | A1 | * | 1/2008 | Huh et al. | ............... 257/40 |
| 2008/0020208 | A1 | * | 1/2008 | Lee et al. | ............... 428/411.1 |
| 2008/0105854 | A1 | * | 5/2008 | Huh et al. | ............... 252/519.21 |
| 2008/0234442 | A1 | * | 9/2008 | Huh et al. | ............... 525/535 |

OTHER PUBLICATIONS

Groenendaal et al., "Poly(3,4-ethylenedioxythiophene) and Its Derivatives: Past, Present, and Future", Advanced Materials 12, No. 7, 2000.

Office action from the Chinese Patent Office issued in Applicant's corresponding Chinese Patent Application No. 2006100827927 dated Feb. 12, 2010 and its English translation.

* cited by examiner

*Primary Examiner*—Douglas MC Ginty
(74) *Attorney, Agent, or Firm*—Robert E. Bushnell, Esq.

(57) ABSTRACT

A composition including a conducting polymer and an ionomer, and an opto-electronic device including the composition are provided. The composition is prepared by doping a conducting polymer with an ionomer which has stabilized association with the conducting polymer backbone, has a low water uptake, has a low content of by-products decomposed by a reaction with electrons, and can physically crosslink with the conducting polymer. Thus, the opto-electronic device including the composition has improved device performance such as device efficiency and lifetime.

22 Claims, 2 Drawing Sheets

COMPOSITION OF CONDUCTING POLYMER AND ORGANIC OPTO-ELECTRONIC DEVICE EMPLOYING THE SAME

CROSS-REFERENCE TO RELATED PATENT APPLICATION AND CLAIM OF PRIORITY

This application claims the benefit of Korean Patent Application No. 10-2005-0042189, filed on May 19, 2005 in the Korean Intellectual Property Office, the disclosure of which is incorporated herein in its entirety by reference.

BACKGROUND OF THE INVENTION

1. Field of the Invention

The present invention relates to a composition of a conducting polymer and an organic opto-electronic device including the same. More particularly, the present invention relates to a composition including a conducting polymer doped with an ionomer, which stabilizes association the conducting polymer backbone, has a low water uptake, has a low content of by-products (or impurities) decomposed by reaction with electrons, and can physically crosslink with the conducting polymer, and to an opto-electronic having increased device performance such as device efficiency and lifetime by using the composition.

2. Description of the Related Art

Opto-electronic devices convert light energy into electric energy or electric energy into light energy, and examples thereof include organic electroluminescent devices, solar cells, transistors, and the like. At present, many studies regarding the formation of a conducting polymer film are being conducted to improve the device performance of an opto-electronic device by efficiently transporting electronic charges injected from the electrodes of the device, i.e., holes and electrons into the device.

In particular, an organic electroluminescent device is an active device in which an electron and a hole recombine in a fluorescent or phosphorescent organic compound thin film (hereinafter referred to as an organic film) when an electric current is supplied to the organic film, thereby emitting light. Generally, the organic electroluminescent device has a multilayer structure including a hole injection layer using a conducting polymer, an emissive layer, an electron injection layer, etc., rather than uses only the emissive layer as an organic film to improve the efficiency of the device and reduce a driving voltage.

Conducting polymers including polyacetylene, polyparaphenylene, poly(phenylene vinylene), polypyrrole, polythiophene, polyfuran, polyaniline, and the polyheteroaromatic vinylenes, undergo either p-and/or n-redox doping by chemical and/or electrochemical processes. The conducting polymer has π-conjugated electrons spread along its backbone and contains delocalized electron structure after doping. P-doping involves partial oxidation of the π-system, whereas n-doping involves partial reduction of the π-system. Polyaniline, the best-known and most fully investigated example, also undergoes doping by a large number of protonic acids. The conductivity of these materials can be tuned by chemical manipulation of the polymer backbone, by the nature of the dopant, by the degree of doping, and by blending with other polymers. In addition, polymeric materials are lightweight, easily processed, and flexible An aqueous PEDOT (Poly(3,4-ethylene dioxythiophene))-PSS (poly(4-styrenesulfonate)) solution, which is commercially available as Baytron-P from Bayer AG, is widely used in the manufacture of an organic electroluminescent device to form a hole injection layer by spin coating it on an ITO (indium tin oxide) electrode. The PEDOT-PSS material has the following structure:

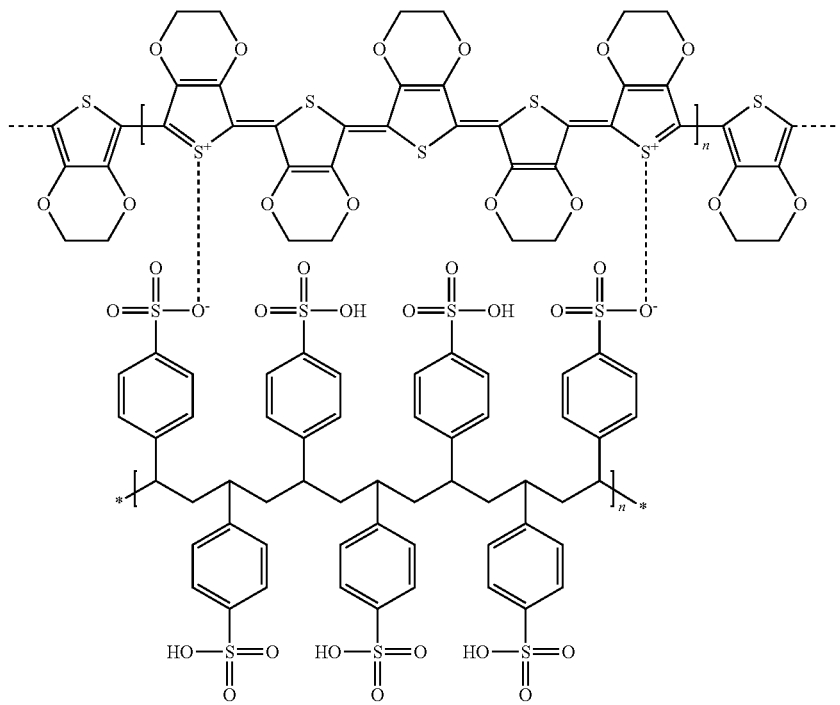

When a hole injection layer is formed using the composition including PEDOT as a conducting polymer doped with PSS as a polyacid, PSS absorbs moisture well, and thus it is not recommended to incorporated PSS in PEDOT when the removal of moisture is required. Further, PSS can be decomposed by reaction with electrons to release a by-product such as sulfate, which may be diffused to an adjacent organic film, for example, an emissive layer. This diffusion of the material derived from the hole injection layer to the emissive layer induces exciton quenching resulting in a reduction in the efficiency and lifetime of the organic electroluminescent device.

Thus, a demand for a novel composition of a conducting polymer is increasing to obtain satisfactory device efficiency and lifetime in an opto-electronic device such as an organic electroluminescent device.

SUMMARY OF THE INVENTION

The present invention provides a composition including a conducting polymer and an ionomer which has a low water uptake, has a low content of by-products decomposed by reaction with electrons, and can crosslink with the conducting polymer.

The present invention also provides a conducting film formed from the composition of conducting polymers.

The present invention also provides an opto-electronic device having improved device performances such as device efficiency and lifetime by including the composition of conducting polymers.

According to an aspect of the present invention, there is provided a composition including a conducting polymer and a first ionomers having a repeating unit represented by Formula (1):

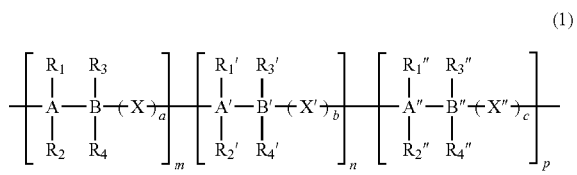

(1)

where $0<m<10,000,000$; $0\leq n\leq 10,000,000$; $0\leq p\leq 10,000,000$; $0\leq a\leq 20$; $0\leq b\leq 20$; $0\leq c\leq 20$; each of A, B, A', B', A", and B" is independently selected from the group consisting of C, Si, Ge, Sn, and Pb; each of $R_1$, $R_2$, $R_3$, $R_4$, $R_1'$, $R_2'$, $R_3'$, $R_4'$, $R_1"$, $R_2"$, $R_3"$, and $R_4"$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group, and at least one of $R_1$, $R_2$, $R_3$, $R_4$, $R_1'$, $R_2'$, $R_3'$ and $R_4'$ is an ionic group or includes an ionic group; and each of X, X', and X" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group.

According to another aspect of the present invention, there is provided a conducting film formed from the composition.

According to another aspect of the present invention, there is provided an opto-electronic device including: a first electrode; a second electrode; and an organic film interposed between the first electrode and the second electrode, the organic film comprising a conducting polymer doped with a first ionomer having a repeating unit represented by Formula (1).

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
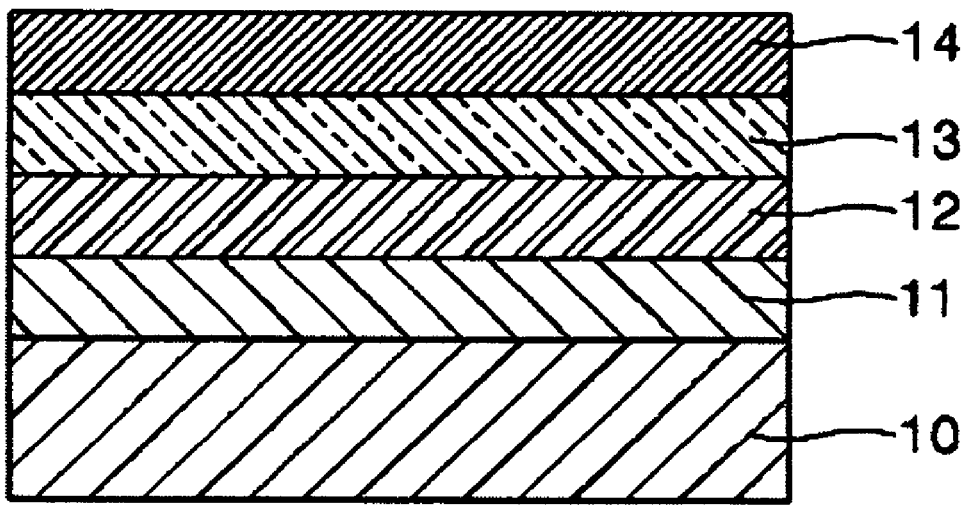
FIGS. 1A through 1D are schematic cross-sectional views of conventional organic electroluminescent devices.

According to an embodiment of the present invention, there is provided a composition including a conducting polymer and a first ionomer having a repeating unit represented by Formula 1:

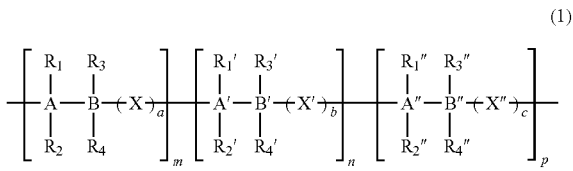

(1)

where
$0<m<10,000,000$;
$0\leq n\leq 10,000,000$;
$0\leq p\leq 10,000,000$;
$0\leq a\leq 20$;
$0\leq b\leq 20$;
$0\leq C\leq 20$;
each of A, B, A', B', A", and B" is independently selected from the group consisting of C, Si, Ge, Sn, and Pb;
each of $R_1$, $R_2$, $R_3$, $R_4$, $R_1'$, $R_2'$, $R_3'$, $R_4'$, $R_1"$, $R_2"$, $R_3"$, and $R_4"$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group, and at least one of $R_1$, $R_2$, $R_3$, $R_4$, $R_1'$, $R_2'$, $R_3'$ and $R_4'$ is an ionic group or includes an ionic group; and each of X, X', and X" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group.

The ionomer generally refers to a polymer including an ionic group and can be represented by Formula (1).

The first ionomer of the present invention includes different ionic groups in each repeating unit in Formula (1). Thus, an ionic group having low acidity is introduced into a unit to provide low water uptake and an ionic group having high acidity is introduced into another unit to enable effective doping in a conducting polymer.

If $0 \leq p \leq 10{,}000{,}000$, the ionomer has a copolymer form with a nonionic monomer having no ionic group, thereby reducing the content of ionic group in the ionomer to an appropriate range and finally reducing the content of by-products decomposed by reaction with electrons. Preferably, the content of the nonionic comonomer is 0.1-99 mol % (i.e., $0.001 < p/(m+n+p) < 0.99$), preferably 1-50 mol % (i.e., $0.001 < p/(m+n+p) < 0.5$), based on 100 mol % of total monomers. When the content of the nonionic comonomer is less than 0.1 mol %, the function of the nonionic group cannot be sufficiently carried out. When the content of the nonionic comonomer is greater than 99 mol %, doping cannot be sufficiently achieved due to a low content of the ionic group.

The composition of the present embodiment includes 100-5,000 parts by weight, preferably 200-1,700 parts by weight, of the ionomer including the repeating unit represented by Formula (1) based on 100 parts by weight of the conducting polymer. When the content of the ionomer is less than 100 parts by weight, doping is not sufficiently achieved, dispersion is not easily carried out, and a poor thin film can be formed. When the content of the ionomer is greater than 5,000 parts by weight, conducting property is significantly reduced.

The composition of the present embodiment may include one or more ionomers, preferably one to three ionomers including the repeating unit represented by Formula (1). When the composition includes more than three ionomers, phase separation is likely to occur and it is difficult to control characteristics of a thin film.

The conducting polymer may be polyethylenedioxythiophene (PEDOT), polyaniline, polypyrrole, polyacetylene, polyphenylene, polyphenylenevinylene, or polythiopene. In particular, polyethylenedioxythiopene and polyaniline are preferable.

The conducting polymer may be a copolymer or blend of two or more polymers selected from the group consisting of polyethylenedioxythiophene (PEDOT), polyaniline, polypyrrole, polyacetylene, polyphenylene, polyphenylenevinylene, and polythiopene.

As described above, in Formula (1), at least one hydrogen of $R_1$, $R_2$, $R_3$, $R_4$, $R_1'$, $R_2'$, $R_3'$, and $R_4'$ may be substituted with an ionic group, which alternatively can be directly bonded to the B or B'. The ionic group may comprise an anion and a cation which forms a couple with the anion. Examples of anion which can be substituted include $PO_3^{2-}$, $SO_3^-$, $COO^-$, $I^-$, and $CH_3COO$ and examples of cation include metal ions such as $Na^+$, $K^+$, $Li^+$, $Mg^{+2}$, $Zn^{+2}$, and $Al^{+3}$; and organic ions such as $H^+$, $NH_4^+$, and $CH_3(CH_2)_nO^+$ in which n is an integer of 0-50.

Monomers may have ionic groups having different acidities from each other. For example, when one of $R_1$, $R_2$, $R_3$ and $R_4$ is $PO_3^{2-}$, one of $R_1'$, $R_2'$, $R_3'$, and $R_4'$ can be substituted with one of $SO_3^-$, $COO^-$, $I^-$, and $CH_3COO^-$. When one of $R_1$, $R_2$, $R_3$ and $R_4$ is $SO_3^-$, one of $R_1'$, $R_2'$, $R_3'$, and $R_4'$ can be substituted with one of $COO^-$, $I^-$, and $CH_3COO^-$.

To further improve the crosslinkability of the conducting polymer and the ionomer, the conducting polymer composition may further include a physical crosslinking agent and/or a chemical crosslinking agent.

The physical crosslinking agent refers to a low or high molecular compound having a hydroxy group (—OH), which functions as a physical bridge between polymer chains without chemical bond. Examples of the physical crosslinking agent include low molecular compounds, such as glycerol and butanol, and high molecular compounds, such as polyvinylalcohol and polyethyleneglycol. Besides, polyethyleneimine and polyvinylpyrrolidone can also be used.

The content of the physical crosslinking agent is 0.001-5 parts by weight, preferably 0.1-3 parts by weight, based on 100 parts by weight of the composition. When the content of the physical crosslinking agent is less than 0.001 part by weight, the function of bridge cannot be sufficiently performed. When the content of the physical crosslinking agent is greater than 5 parts by weight, the thin film morphology of the conducting polymer film is poor.

The chemical crosslinking agent refers to a chemical material which chemically crosslinks compounds, can induce in-situ polymerization, and can form interpenetrating polymer network (IPN). Silane-based materials are mainly used, and an example thereof includes tetraethyloxysilane (TEOS). Besides, polyaziridine, melamine, and epoxy-based materials can be used.

The content of the chemical crosslinking agent is 0.001-50 parts by weight, preferably 1-10 parts by weight, based on 100 parts by weight of the composition. When the content of the chemical crosslinking agent is less than 0.001 part by weight, the function of bridge cannot be sufficiently performed. When the content of the chemical crosslinking agent is greater than 50 parts by weight, the conducting property of the conducting polymer is significantly deteriorated.

Examples of the ionomer having the repeating unit represented by Formula (1) include compounds represented by Formulae (2) to (4):

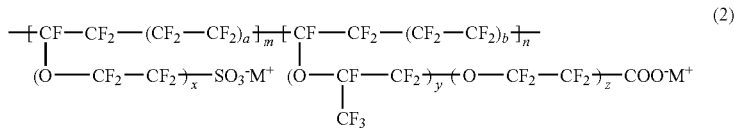

(2)

where $0<m<10,000,000$, $0<n<10,000,000$, $0\leq a\leq 20$, $0\leq b\leq 20$, each of x, y, and z is independently a number from 0 to 5, and each M is independently hydrogen or sodium;

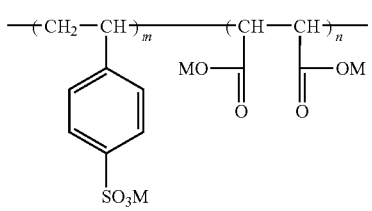

(3)

where $0<m<10,000,000$, $0<n<10,000,000$, and each M is independently hydrogen or sodium; and

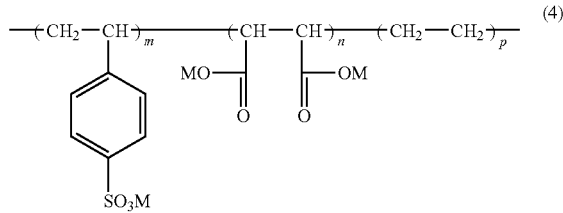

(4)

where $0<m<10,000,000$, $0<n<10,000,000$, $0\leq p<10,000,000$, and each M is independently hydrogen or sodium.

The composition of the present embodiment may further a second ionomer in addition to the conducting polymer and the first ionomer. The second ionomer may be an ionomer having the repeating unit represented by Formula (1) in which $1\leq m\leq 10,000,000$, n=0 and p=0. A preferred degree of polymerization of the second ionomer may be 10 to 10,000,000.

Examples of the second ionomer include hydrocarbon, fluorocarbon, and silicone polymers having the repeating unit represented by Formula (1) in which $1\leq m\leq 10,000,000$, $1\leq n\leq 10,000,000$, and p=0. When the second ionomer is fluorocarbon, a perfluorinated ionomer is preferable. Such a perfluorinated ionomer may be an ionomer having a repeating unit represented by Formula (2) or (3). In particular, an ionomer represented by Formula (5) is preferable:

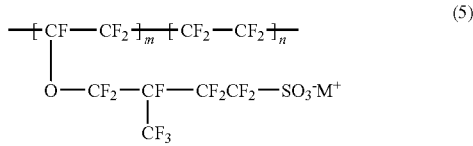

(5)

where $0<m<10,000,000$, $0<n<10,000,000$, and each M is independently hydrogen or sodium.

The amount of the second ionomer in the composition may likewise be 100-5,000 parts by weight, preferably 200-1,700 parts by weight, based on 100 parts by weight of the conducting polymer. When the amount of the second ionomer is less than 100 parts by weight, the effect of adding the second ionomer cannot be sufficiently obtained. When the amount of the second ionomer is greater than 5,000 parts by weight, conducting property is reduced.

Examples of the alkyl group include straight chain or branched chain methyl, ethyl, propyl, isobutyl, sec-butyl, tert-butyl, pentyl, iso-amyl, hexyl, etc. At least one hydrogen atom on the alkyl group may be substituted with a halogen atom, a hydroxy group, a nitro group, a cyano group, a substituted or unsubstituted amino group (—NH$_2$, —NH(R), or —N(R')(R''), in which each of R' and R'' is independently a C1-C10 alkyl group), an amidino group, a hydrazine group, a hydrazone group, a carboxylic group, a sulfonic acid group, a phosphoric acid group, a C1-C20 alkyl group, a C1-C20 halogenated alkyl group, a C1-C20 alkenyl group, a C1-C20 alkynyl group, a C1-C20 heteroalkyl group, a C6-C20 aryl group, a C6-C20 arylalkyl group, a C6-C20 heteroaryl group, or a C6-C20 heteroarylalkyl group.

The heteroalkyl group refers to the alkyl group in which at least one carbon atom, preferably 1-5 carbon atoms on the backbone are substituted with heteroatoms such as oxygen atom, sulfur atom, nitrogen atom, phosphorous atom, etc.

The aryl group refers to a carbocyclic aromatic system containing one or more aromatic rings. The rings may be attached or fused together using a pendent method. Examples of the aryl group include aromatic groups such as phenyl, naphthyl, tetrahydronaphthyl, etc. At least one hydrogen atom of the aryl group can be substituted with the substituents of the alkyl group.

The heteroaryl group refers to a cyclic aromatic system including 1, 2, or 3 heteroatoms selected from N, O, P, and S and having 5 to 30 ring members. The rings can be attached or fused together using a pendent method. At least one hydrogen atom of the heteroaryl group can be substituted with the substituents of the alkyl group.

The alkoxy group denotes a radical of —O-alkyl, in which the alkyl is as defined above. Examples of the alkoxy group include methoxy, ethoxy, propoxy, isobutyloxy, sec-butyloxy, pentyloxy, iso-amyloxy, hexyloxy, etc. At least one hydrogen atom of the alkoxy group can be substituted with the substituents of the alkyl group.

The heteroalkoxy group is the alkoxy group in which at least one, for example, oxygen, sulfur, or nitrogen is present in an alkyl chain, and examples of thereof include CH$_3$CH$_2$OCH$_2$CH$_2$O—, C$_4$H$_9$OCH$_2$CH$_2$OCH$_2$CH$_2$O—, and CH$_3$O(CH$_2$CH$_2$O)$_n$H.

The arylalkyl group is the aryl group in which some hydrogen atoms are substituted with lower alkyl radicals, for example, methyl, ethyl, and propyl. Examples of the arylalkyl group include benzyl and phenylethyl. At least one hydrogen atom of the arylalkyl group can be substituted with the substituents of the alkyl group.

The heteroarylalkyl group refers to the heteroaryl group in which some hydrogen atoms are substituted with lower alkyl groups. At least one hydrogen atom of the heteroarylalkyl group can be substituted with the substituents of the alkyl group.

The aryloxy group denotes a radical of —O-aryl, in which the aryl is as defined above. Examples of the aryloxy group include phenoxy, naphthoxy, anthracenyloxy, phenanthrenyloxy, fluorenyloxy, and indenyloxy. At least one hydrogen atom of the aryloxy group can be substituted with the same substituents as in the alkyl group.

The heteroaryloxy group denotes a radical of —O-heteroaryl, in which the heteroaryl is as defined above.

Examples of the heteroaryloxy group include benzyloxy and phenylethyloxy. At least one hydrogen atom of the heteroaryloxy group can be substituted with the substituents of the alkyl group.

The cycloalkyl group refers to a monovalent monocyclic system having 5-30 carbon atoms. At least one hydrogen atom of the cycloalkyl group can be substituted with the substituents of the alkyl group.

The heterocycloalkyl group a monovalent monocyclic system including 1, 2, or 3 hetero atoms selected from N, O, P, and S and having 5-30 ring members. At least one hydrogen atom of the cycloalkyl group can be substituted with the substituents of the alkyl group.

The alkyl ester group refers to the alkyl group combined with an ester group.

The heteroalkylester group refers to the heteroalkyl group combined with an ester group.

The arylester group refers to the aryl group combined with an ester group.

The heteroarylester group refers to the heteroaryl group combined with an ester group.

The amino group represents —NH$_2$, —NH(R) or —N(R')(R''), in which each of R' and R'' is independently an alkyl group having 1-10 carbon atoms.

The halogen may be fluorine, chlorine, bromine, iodine, or astatine. In particular, fluorine is preferable.

At least one hydrogen atom included in the above-mentioned substituents may be substituted with a halogen atom, preferably fluorine.

The composition of a conducting polymer can be used in an opto-electronic device. Examples of the opto-electronic device include an organic electroluminescent device, an organic solar cell, an organic transistor, and an organic memory device.

In particular, in the organic electroluminescent device, the composition of a conducting polymer is used in a charge injection layer, i.e., a hole or electron injection layer to inject efficiently holes or electrons into the light emitting polymer, thereby increasing the luminous intensity and the efficiency of the organic electroluminescent device.

In the organic solar cell, the conducting polymer is likewise used as an electrode or an electrode buffer layer to increase quantum efficiency, and in the organic transistor, it is also used as an electrode material in a gate, a source-drain electrode, etc.

An organic electroluminescent device employing the composition of a conducting polymer will now be described.

FIGS. 1A through 1D are schematic cross-sectional views of organic electroluminescent devices according to various embodiments of the present invention.

In the organic electroluminescent device illustrated in FIG. 1A, an emissive layer 12 is formed on a first electrode 10, a hole injection layer (HIL) (also referred to as "buffer layer") 11 is formed between the first electrode 10 and the emissive layer 12, a hole blocking layer (HBL) 13 is formed on the emissive layer 12, and a second electrode 14 is formed thereon.

Figure 1B:
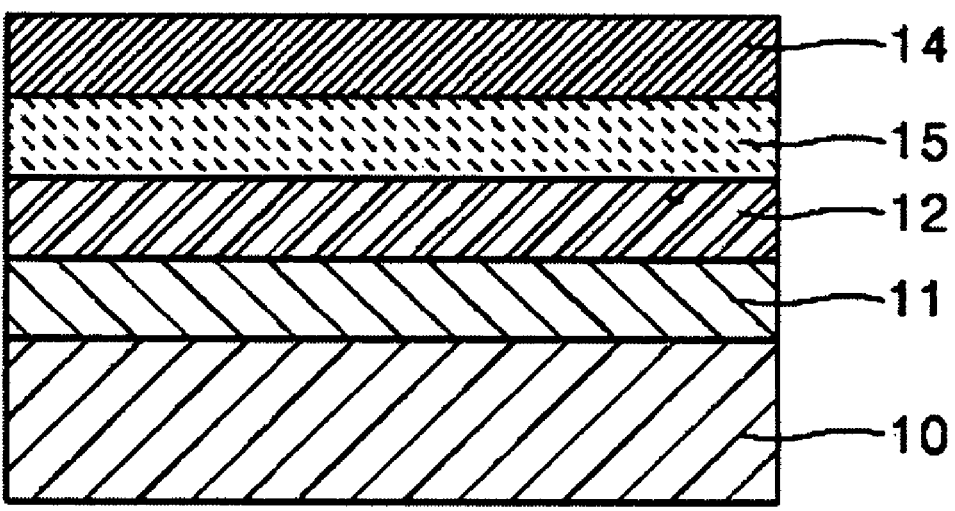

The organic electroluminescent device illustrated in FIG. 1B has the same structure as that of FIG. 1A, except that an electron transport layer (ETL) 15 instead of the hole blocking layer (HBL) 13 is formed on the emissive layer 12.

Figure 1C:
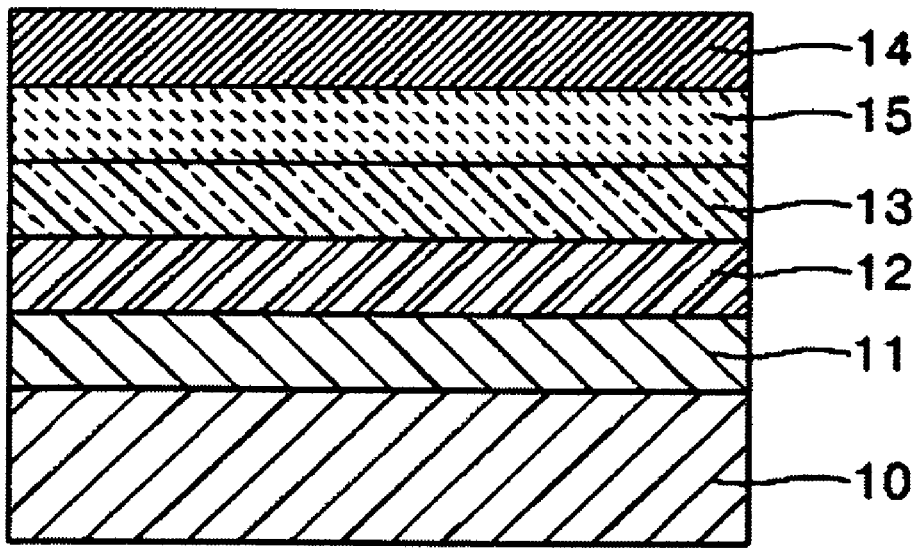

The organic electroluminescent device illustrated in FIG. 1C has the same structure as that of FIG. 1A, except that a hole blocking layer (HBL) 13 and an electron transport layer (ETL) 15, which are sequentially formed, instead of the hole blocking layer (HBL) 13 is formed on the emissive layer 12.

Figure 1D:
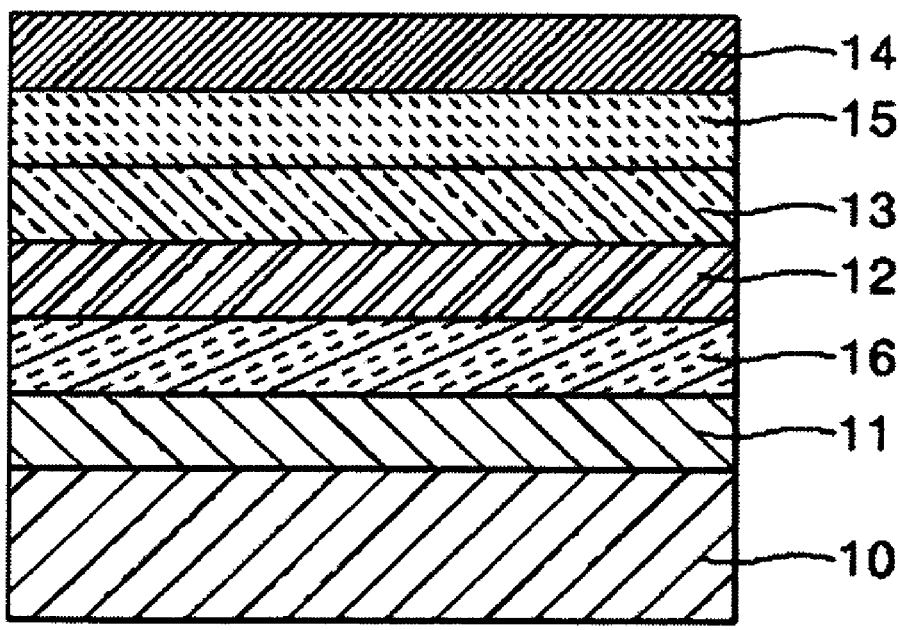

The organic electroluminescent device illustrated in FIG. 1D has the same structure as that of FIG. 1C, except that a hole transport layer (HTL) 16 is further formed between the hole injection layer (HIL) 11 and the emissive layer 12. The hole transport layer (HTL) 16 prevents penetration of impurities from the hole injection layer (HIL) 11 to the emissive layer 12.

The organic electroluminescent devices having the structures as illustrated in FIGS. 1A through 1D can be manufactured using typical methods, which are not particularly limited.

A method of manufacturing an organic electroluminescent device according to an embodiment of the present invention will now be described.

A first patterned electrode 10 is first formed on a substrate (not shown). The substrate is a substrate used in the conventional organic electroluminescent device and may be a glass substrate or a transparent plastic substrate having good manageability and water proofness. The thickness of the substrate may be 0.3-1.1 mm.

A material for the first electrode 10 is not particularly limited. If the first electrode is a cathode, the cathode is composed of a conducting metal or an oxide thereof, which makes it easy to inject holes. Examples of such a material include Indium tin oxide (ITO), indium zinc oxide (IZO), Ni, Pt, Au, Ir, etc.

The substrate having the first electrode 10 formed thereon is washed, and then is subjected to a UV and ozone treatment. When the substrate is washed, an organic solvent such as isopropanol (IPA) or acetone is used.

The hole injection layer (HIL) 11 including the composition of a conducting polymer of the present invention is formed on the first electrode 10 of the washed substrate. The formation of the hole injection layer (HIL) 11 reduces contact resistance of the first electrode 10 and the emissive layer 12 and improves the hole transport ability of the first electrode 10 to emissive layer 12, thereby improving the driving voltage and the lifetime of the organic electroluminescent device.

The hole injection layer (HIL) 11 is formed by spin coating a HIL forming composition, which is prepared by dissolving the composition of a conducting polymer in a solvent, on the first electrode 10 and drying it. The HIL forming composition is used in a form diluted to 0.5-10% by weight by dissolving the conducting polymer composition in a solvent such as water, alcohol, other organic solvents or mixed solvents which are composed of the above-mentioned conducting polymer and an ionomer in a weight ratio of 1:1 to 1:30 in a solvent.

The solvent may be any solvent that can dissolve the composition of a conducting polymer and examples thereof include water, alcohol, dimethylformamide (DMF), toluene, xylene, and chlorobenzene.

The thickness of the hole injection layer (HIL) 11 may be 5-100 nm, preferably 20-70 nm, more preferably 50 nm. When the thickness of the hole injection layer (HIL) is less than 5 nm, injection of holes is not fully performed. When the thickness of the hole injection layer (HIL) is greater than 100 nm, light transmittance may be reduced.

The emissive layer 12 is formed on the hole injection layer (HIL) 11. A material for the emissive layer is not particularly limited, but examples thereof include oxadiazole dimer dyes (Bis-DAPOXP), spiro compounds (Spiro-DPVBi, Spiro-6P), triarylamine compounds, bis(styryl)amine (DPVBi, DSA), Firpic, CzTT, Anthracene, TPB, PPCP, DST, TPA, OXD-4, BBOT, AZM-Zn, etc. which are blue materials, Coumarin 6, C545T, Quinacridone, Ir(ppy)$_3$, etc., which are green materials, and DCM1, DCM2, Eu (thenoyltrifluoroacetone)3 (Eu (TTA)3), butyl-6-(1,1,7,7-tetramethyljulolidyl-9-enyl)-4H-pyran (DCJTB), etc., which are red materials. In addition, examples of the polymer light-emitting material include polymers such as phenylene, phenylene vinylene, thiophene, fluorene, and spiro-fluorene-based polymers and aromatic compounds containing nitrogen, but are not limited thereto.

The thickness of the emissive layer 12 may be 10-500 nm, preferably 50-120 nm. In particular, a blue emissive layer may have a thickness of 70 nm. When the thickness of the emissive layer is less than 10 nm, leakage current increases, resulting in a reduction in efficiency and lifetime. When the thickness of the emissive layer is greater than 500 nm, driving voltage is significantly increased.

The emissive layer forming composition further includes a dopant, if necessary. The amount of the dopant varies depending on a material for the emissive layer, but may be generally 30-80 parts by weight based on 100 parts by weight of a material for the emissive layer (total weight of the host and the dopant). When the amount of the dopant is not within the range, the luminous characteristics of an electroluminescent display device are reduced. Examples of the dopant include arylamine, perylenes, pyrroles, hydrazones, carbazoles, stilbenes, starburstes, oxadiazoles and derivatives thereof.

The hole transport layer (HTL) 16 may be optionally formed between the hole injection layer (HIL) 11 and the emissive layer 12.

A material for the hole transport layer (HTL) is not particularly limited, but may be selected from a compound having a carbazole group and/or an arylamine group, which transport holes, a phthalocyanine-based compound, and a triphenylene derivative. More particularly, the hole transport layer (HTL) may be composed of at least one material selected from the group consisting of 1,3,5-tricarbazolylbenzene, 4,4'-biscarbazolylbiphenyl, polyvinylcarbazole, m-biscarbazolylbenzene, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4, 4'-diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), IDE320 (Idemitsu Kosan Co., LTD.), poly(9,9-dioctylfluorene-co-N-(4-butylphenyl) diphenylamine (TFB), and poly(9,9-dioctylfluorene-co-bis-N,N-phenyl-1,4-phenylenediamine) (PFB), but are not limited thereto.

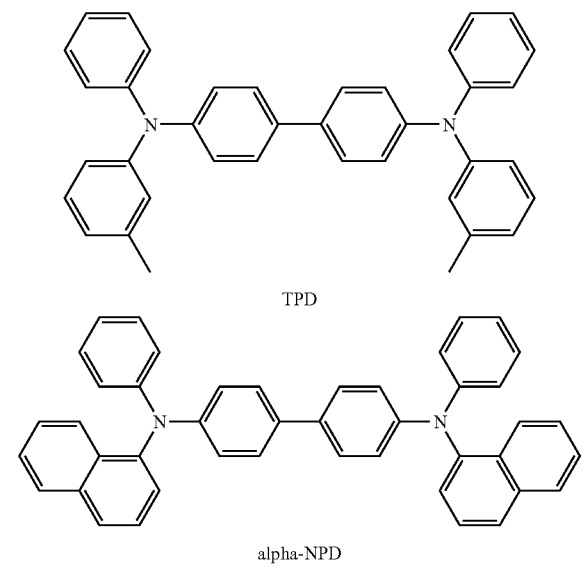

TPD alpha-NPD

The hole transport layer (HTL) may have a thickness of 1-100 nm, preferably 5-50 nm, more preferably 30 nm. When the thickness of the hole transport layer (HTL) is less than 1 nm, the hole transport ability can be reduced. When the thickness of the hole transport layer (HTL) is greater than 100 nm, the driving voltage can be increased.

The hole blocking layer (HBL) 13 and/or the electron transport layer (ETL) 15 are optionally formed on the emissive layer 12 using a deposition or spin coating method. The hole blocking layer (HBL) 13 prevents migration of excitons from the light emitting material to the electron transport layer (ETL) 15 or migration of holes to the electron transport layer (ETL) 15.

The hole blocking layer (HBL) 13 may be composed of phenanthrolines (e.g., BCP available from UDC), imidazoles, triazoles, oxadiazoles (e.g., PBD), aluminium complex (available from UDC), or BAlq having the following structure:

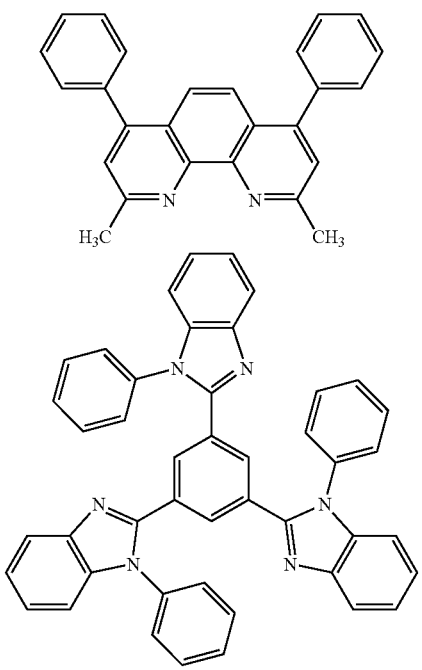

Compound containing phenanthroline Compound containing imidazole

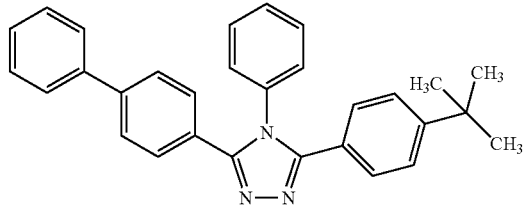

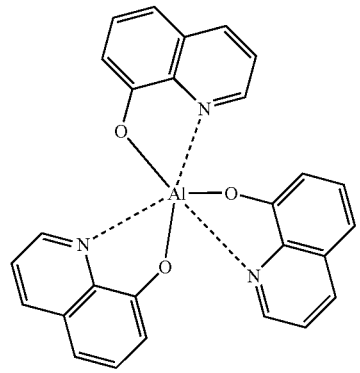
Alq3

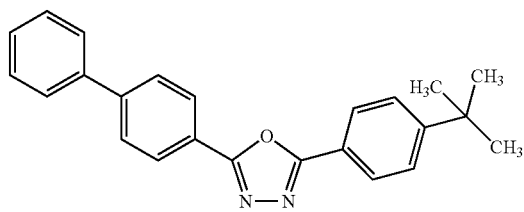

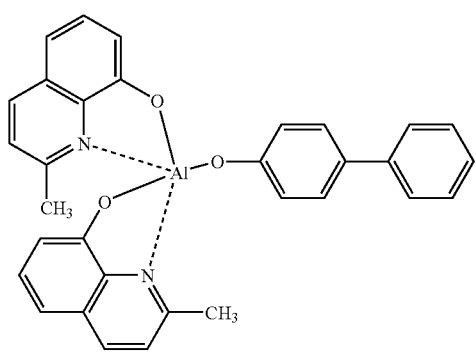
BAlq

Compound containing triazole Compound containing oxadiazole

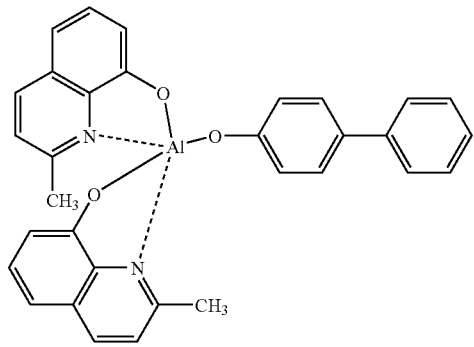

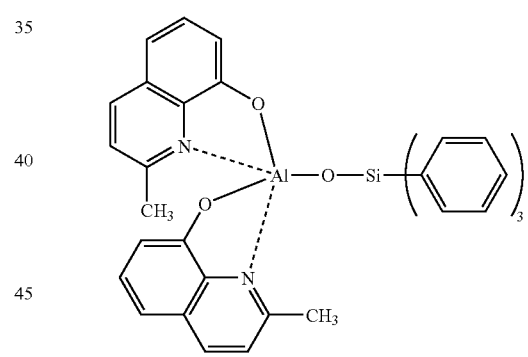
SAlq

BAlq.

The electron transport layer (ETL) 15 may be composed of oxazoles, isoxazoles, triazoles, isothiazoles, oxadiazoles, thiadiazoles, perylenes, aluminium complexes (e.g., Alq3 (tris(8-quinolinolato)-aluminium), BAlq, SAlq, Almq3), gallium complexes (e.g., Gaq'2OPiv, Gaq'2OAc, 2(Gaq'2)).

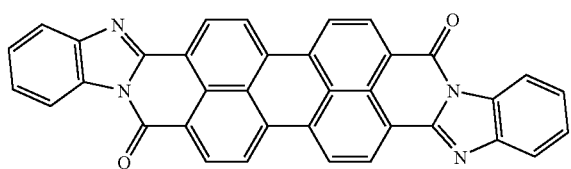

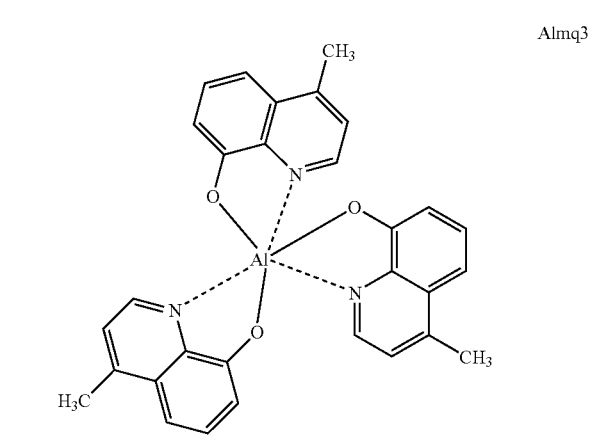
Almq3

-continued

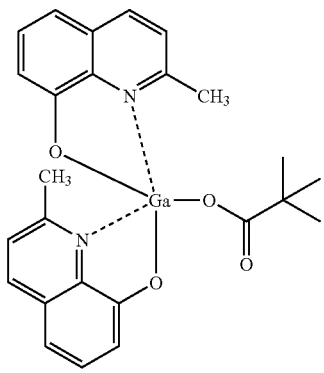

Gaq'2OPiv

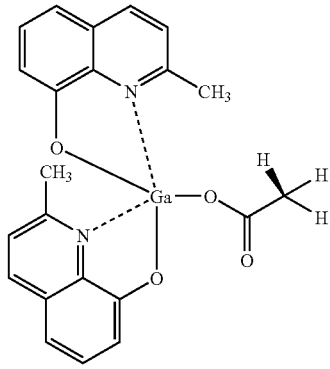

Gaq'2Oac

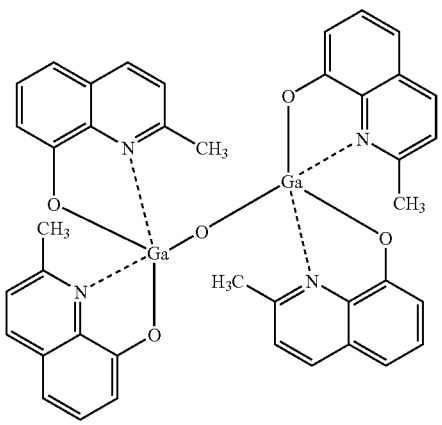

2(Gaq'2)

The thickness of the hole blocking layer (HBL) may be 5-100 nm and the thickness of the electron transport layer (ETL) may be 5-100 nm. When the thickness of the hole blocking layer (HBL) and the thickness of the electron transport layer (ETL) are not within the ranges, an electron transport ability and a hole blocking ability are poor.

Then, the second electrode 14 is formed on the resultant and sealed to complete an organic electroluminescent device.

A material for the second electrode 14 is not particularly limited, but may be a metal having low work function, i.e., Li, Cs, Ba, Ca, Ca/Al, LiF/Ca, LiF/Al, $BaF_2$/Ca, Mg, Ag, Al, or an alloy thereof, or a multilayer thereof. The thickness of the second electrode 14 may be 50-3000 Å.

The organic electroluminescent device of the present invention does not require a particular apparatus or method for manufacturing it and can be manufactured using a conventional manufacturing method.

The present invention will now be described in greater detail with reference to the following examples. The following examples are for illustrative purposes only and are not intended to limit the scope of the invention.

EXAMPLE 1

Composition of PEDOT Conducting Polymer and Ionomer

An ionomer represented by Formula (6) available from DOW CHEMICAL was dissolved in a mixed solvent (water: ethanol=4:6) to obtain a solution including 1.0 wt % of the ionomer. PEDOT was then polymerized according to a known synthesis method (Groenendaal et al. Advanced Materials, Vol. 12, No. 7, p481, 2000 which is incorporated herein by reference). More particularly, 3,4-ethylenedioxythiopene (EDOT) commercially available as Baytron M from H. C. Starck was polymerized in a ratio of 10 wt % with respect to the weight of the ionomer represented by Formula (6) in the solution by oxidative chemical polymerization to complete the desired composition.

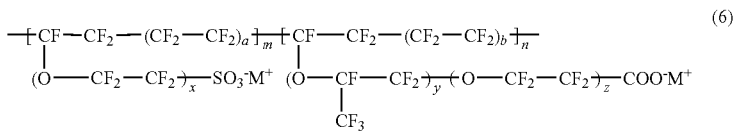

(6)

in which a=1, b=1, x=1, y=1, z=1, M is H, m=5, and n=5.

EXAMPLE 2

Composition of PANI Conducting Polymer and Ionomer

An ionomer represented by Formula (6) available from DOW CHEMICAL was dissolved in a mixed solvent (volume ratio of water:2-propanol=4:6) to obtain a solution including 2.0 wt % of the ionomer. Polyaniline (PANI) was then doped with camphor sulfonic acid to obtain a conducting polymer. Subsequently, PANI and the solution including 2.0 wt % of the ionomer were mixed in a weight ratio of 1:6 to complete the desired composition.

EXAMPLE 3

Composition of PEDOT Conducting Polymer and Ionomer

An ionomer represented by Formula (7), i.e., poly(4-styrenesulfonic acid-co-maleic acid) available from Aldrich was dissolved in water to obtain a solution including 2.0 wt % of the ionomer. PEDOT was then polymerized according to a known synthesis method (Groenendaal et al. Advanced Materials, Vol. 12, No. 7, p481, 2000). Subsequently, PEDOT and the solution including 2.0 wt % of the ionomer were mixed in a weight ratio of 1:10 to complete the desired composition.

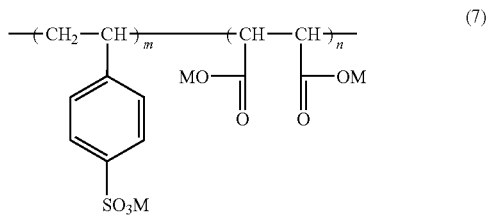

(7)

in which m=100, n=200, and M is H.

EXAMPLE 4

Composition of PEDOT Conducting Polymer and Ionomer

An ionomer represented by Formula (8) (the so-called NAFION) was purchased from Sigma-Aldrich Co. as a solution of 5 wt % ionomer in a mixed solvent (volume ratio of water:2-propanol=4.5:5.5). Then, PEDOT and the solution of 5.0 wt % ionomer were mixed with each other in a weight ratio of 1:1 in a mixed solvent containing water and 2-propanol to prepare a solution including 1.5 wt % of solids.

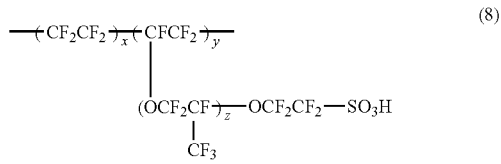

(8)

in which x=5-11, y=1, and z=1.

EXAMPLE 5

Manufacturing of Organic Electroluminescent Device

A Corning 15 $\Omega/cm^2$ (1200 Å) ITO glass substrate was cut to a size of 50 mm×50 mm×0.7 mm and was ultrasonically washed in isopropyl alcohol and pure water, respectively, for 15 min, and then washed with UV and ozone for 15 min.

The aqueous conducting polymer solution prepared in Example 1 was spin coated on the substrate to form a 50 nm thick HIL. Then, the result was heat-treated at a temperature of 200° C. for 10 min in a glove-box under a nitrogen atmosphere.

Spirofluorene-based light emitting polymer, which was a blue light emitting material, was used to form a 70 nm thick emissive layer on the HTL. The result was heat-treated at a temperature of 180° C. for 1 hour. Then, $BaF_2$ was deposited on the emissive layer to form a 4 nm thick EIL at a deposition rate of 0.01 nm/s. A 2.7 nm thick Ca was deposited on the EIL at a deposition rate of 0.1 nm/s, and a 250 nm thick Al were formed at the deposition rate of at least 0.1 nm/s to complete an organic electroluminescent device. This organic electroluminescent device was called Sample A.

COMPARATIVE EXAMPLE

An organic electroluminescent device was manufactured in the same manner as in Example 5, except that a PEDOT/PSS aqueous solution commercially available as Batron P 4083 from Bayer was used as a material for the hole injection layer (HIL). The obtained organic electroluminescent device was called Sample B.

EXPERIMENTAL EXAMPLE 1

Evaluation of Efficiency

The efficiency of Sample A and Sample B was determined using a SpectraScan PR650 spectroradiometer.

Sample A had a lifetime of about 600 hrs and Sample B had a lifetime of about 200 hrs when they were operated at an initial luminance of 800 $cd/m^2$. Thus, the organic electroluminescent device of the present invention had a lifetime approximately 300% higher than that of the conventional organic electroluminescent device.

Accordingly, it can be seen that the organic electroluminescent device having a hole injection layer (HIL) composed of the composition of the present invention has good luminous efficiency.

EXPERIMENTAL EXAMPLE 2

Evaluation of Lifetime

The lifetime of Sample A and Sample B was investigated. The lifetime was determined by measuring luminance with respect to time using a photodiode and was represented by a time at which an initial luminance was reduced to 50%.

Sample A exhibited an efficiency of 10 cd/A and Sample B exhibited an efficiency of 6 cd/A. Thus, an increase in efficiency of 66.7% was obtained.

As described above, the composition of the present invention is prepared by doping a conducting polymer with an ionomer which has a low water uptake, has a low content of by-products decomposed by a reaction with electrons, and can crosslink with the conducting polymer. Thus, an optoelectronic device including the composition has improved efficiency and lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition comprising:
   a conducting polymer; and
   a first ionomer having a repeating unit represented by Formula (1):

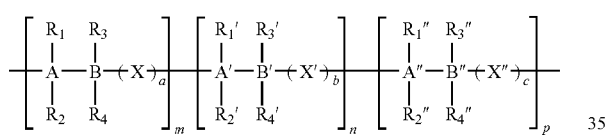

(1)

where $0<m<10,000,000$;
$0 \leq n \leq 10,000,000$;
$0 \leq p \leq 10,000,000$;
$0 \leq a \leq 20$;
$0 \leq b \leq 20$;
$0 \leq c \leq 20$;
each of A, B, A', B', A", and B" is independently selected from the group consisting of C, Si, Ge, Sn, and Pb;
each of $R_1$, $R_2$, $R_3$, $R_4$, $R_1'$, $R_2'$, $R_3'$, $R_4'$, $R_1''$, $R_2''$, $R_3''$, and $R_4''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group, and at least one of $R_1$, $R_2$, $R_3$, $R_4$, $R_1'$, $R_2'$, $R_3'$ and $R_4'$ is an ionic group or includes an ionic group; and each of X, X', and X" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group, wherein said first ionomer is represented by Formula (2):

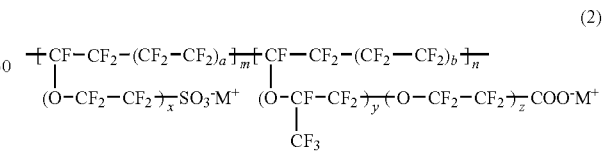

(2)

where $0<m<10,000,000$, $0<n<10,000,000$, $0 \leq a \leq 20$, $0 \leq b \leq 20$, each of x, y, and z is independently a number of 0 to 5, and each M is independently hydrogen or sodium.

2. The composition of claim 1, wherein the amount of the first ionomer is in the range from 100 to 5,000 parts by weight based on 100 parts by weight of the conducting polymer.

3. The composition of claim 1, wherein the repeating unit of the first ionomer is represented by one of Formulae (3) and (4):

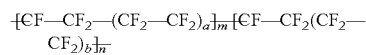

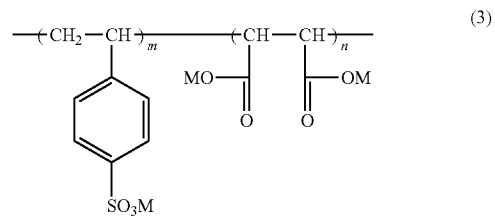

(3)

where $0<m<10,000,000$, $0<n<10,000,000$, and each M is independently hydrogen or sodium; and

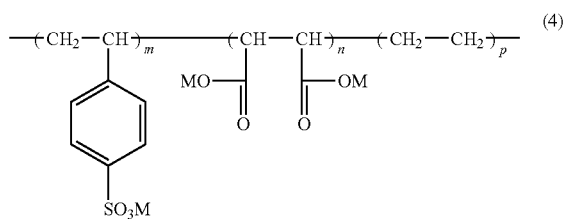

where 0<m<10,000,000, 0<n<10,000,000, 0≦p<10,000,000, and each M is independently hydrogen or sodium.

4. The composition of claim 1, further comprising a second ionomer having a repeating unit represented by Formula (1) in which 1≦m≦10,000,000, 1≦n≦10,000,000 and p=0, and the first ionomer and the second ionomer are different from each other.

5. The composition of claim 4, wherein the second ionomer is a hydrocarbon, fluorocarbon or silicone polymer represented by Formula (1) in which 1≦m≦10,000,000, n=0 and p=0.

6. The composition of claim 4, wherein the second ionomer is a perfluorinated ionomer.

7. The composition of claim 4, wherein the second ionomer comprises an ionomers represented by Formula (5):

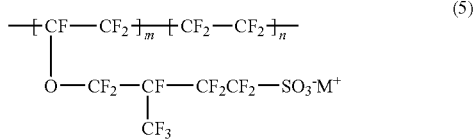

where 0<m<10,000,000, 0<n<10,000,000, and each M is independently hydrogen or sodium.

8. The composition of claim 1, wherein the conducting polymer is at least one polymer selected from the group consisting of polyethylenedioxythiophene (PEDOT), polyaniline, polypyrrole, polyacetylene, polyphenylene, polyphenylenevinylene, and polythiopene.

9. The composition of claim 1, wherein the conducting polymer is a copolymer or a blend of at least two polymers selected from the group consisting of polyethylenedioxythiophene (PEDOT), polythiopene, polyaniline, polypyrrole, polyacetylene, polyphenylene, polyfuran, polyphenylenevinylene and the polyheteroaromatic vinylenes.

10. The composition of claim 1, wherein the ionic group comprises anion selected from the group consisting of $PO_3^{2-}$, $SO_3^-$, $COO^-$, $I^-$, and $CH_3COO^-$, and a cation which forms a couple with the anion and is a metal ion selected from the group consisting of $Na^+$, $K^+$, $Mg^{+2}$, $Zn^{+2}$, and $Al^{+3}$, or an organic ion selected from the group consisting of $H^+$, $NH_4^+$, and $CH_3(CH_2)_nO^+$ in which n is an integer of 0 to 50.

11. The composition of claim 1, wherein the halogen atom is fluorine.

12. The composition of claim 1, further comprising at least one of a physical crosslinking agent and a chemical crosslinking agent.

13. The composition of claim 12, wherein the physical crosslinking agent is a low molecular compound or a high molecular compound having a hydroxy group.

14. The composition of claim 12, wherein the physical crosslinking agent is a compound selected from the group consisting of glycerol, butanol, polyvinylalcohol, polyethyleneglycol, polyethyleneimine, and polyvinylpyrrolidone.

15. The composition of claim 12, wherein the chemical crosslinking agent is a compound selected from the group consisting of tetraethyloxysilane (TEOS), polyaziridine, melamine-based materials, and epoxy-based materials.

16. The composition of claim 1, wherein the first ionomer is represented by Formula (6):

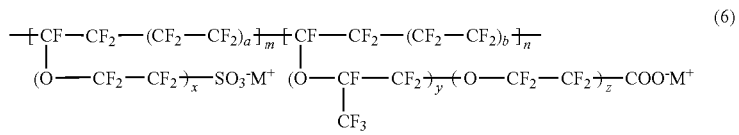

in which a=1, b=1, x=1, y=1, z=1, M is H, m≦5, and n=5.

17. The composition of claim 1, wherein the content of nonionic comonomers is 0.1 to 99 mol % based on 100 mol % of total monomers of the composition.

18. A conducting film formed from the composition of claim 1.

19. An opto-electronic device comprising the conducting film of claim 18.

20. The opto-electronic device of claim 19, which is an organic electroluminescent device, an organic solar cell, an organic transistor, or an organic memory device.

21. An opto-electronic device, comprising:
a first electrode;
a second electrode; and
an organic film interposed between the first electrode and the second electrode, the organic film comprising the composition of claim 1.

22. The opto-electronic device of claim 21, wherein the organic film comprises an emissive layer and a hole injection layer comprising the conducting polymer doped with the first ionomer.

* * * * *